(12) United States Patent
Felk et al.

(10) Patent No.: US 8,704,363 B2
(45) Date of Patent: Apr. 22, 2014

(54) INTERFACE PLATE BETWEEN INTEGRATED CIRCUITS

(75) Inventors: Yacine Felk, Grenoble (FR); Alexis Farcy, La Ravoire (FR)

(73) Assignee: STMicroelectronics S.A., Montrouge (FR)

( * ) Notice: Subject to any disclaimer, the term of this patent is extended or adjusted under 35 U.S.C. 154(b) by 263 days.

(21) Appl. No.: 12/910,229

(22) Filed: Oct. 22, 2010

(65) Prior Publication Data

US 2011/0095437 A1    Apr. 28, 2011

(30) Foreign Application Priority Data

Oct. 23, 2009   (FR) ...................................... 09 57445

(51) Int. Cl.
*H01L 23/34*    (2006.01)

(52) U.S. Cl.
USPC ....... 257/718; 257/774; 257/776; 257/E23.08

(58) Field of Classification Search
USPC .............................. 257/718, 774, 776, E23.08
See application file for complete search history.

(56) References Cited

U.S. PATENT DOCUMENTS

| | | | |
|---|---|---|---|
| 6,255,899 B1 | 7/2001 | Bertin et al. | |
| 8,154,134 B2 * | 4/2012 | Bonifield et al. | ............. 257/774 |
| 2002/0028595 A1 | 3/2002 | Higashi et al. | |
| 2002/0038344 A1 | 3/2002 | Ullman et al. | |
| 2004/0084781 A1 * | 5/2004 | Ahn et al. | ...................... 257/777 |
| 2005/0085075 A1 | 4/2005 | Shimada | |
| 2006/0001153 A1 | 1/2006 | Sakamoto | |
| 2006/0043583 A1 | 3/2006 | Tamagawa et al. | |
| 2006/0128059 A1 | 6/2006 | Ahn et al. | |
| 2009/0000652 A1 * | 1/2009 | von Windheim et al. | ..... 136/230 |

FOREIGN PATENT DOCUMENTS

| | | |
|---|---|---|
| JP | 2005294760 | 10/2005 |
| JP | 2009231729 | 10/2009 |

OTHER PUBLICATIONS

French Search Report dated May 12, 2010 from corresponding French Application No. 09/57445.

* cited by examiner

*Primary Examiner* — Michelle Mandala
(74) *Attorney, Agent, or Firm* — Wolf, Greenfield & Sacks, P.C.

(57) ABSTRACT

An interface plate capable of being mounted between first and second surface-mounted electronic chips. The plate includes a plurality of first, second, and third through openings, the first openings being filled with a conductive material and being arranged to be in front of pads of the first and second chips during the assembly, the second openings being filled with a second material, the third openings being filled with a third material, the second and third materials forming two complementary components of a thermoelectric couple.

10 Claims, 2 Drawing Sheets

INTERFACE PLATE BETWEEN INTEGRATED CIRCUITS

CROSS REFERENCE TO RELATED APPLICATIONS

This application claims the priority benefit of French patent application number 09/57445, filed on Oct. 23, 2009, entitled "INTERFACE PLATE BETWEEN INTEGRATED CIRCUITS," which is hereby incorporated by reference to the maximum extent allowable by law.

BACKGROUND OF THE INVENTION

1. Field of the Invention

The present invention relates to the mounting of electronic chips on one another to form so-called three-dimensional integration structures.

2. Discussion of the Related Art

Generally, an electronic system comprises several electronic chips, for example, processors and memories. To connect these chips, it is usual to mount these chips on the same substrate and to connect each of the chips to the substrate.

To decrease the occupied surface area and make the assembly more reliable, so-called three-dimensional structures have been provided, in which a first surface-mounted chip is directly mounted on a second chip to which it is connected.

Since each of the two chips may be associated with a different substrate, for example made of glass, silicon or gallium arsenide, the connection of the two chips becomes difficult. Indeed, the chips may have different mechanical properties. Further, the connection pads of the two chips may be sized differently. The electric connection between the two chips is thus made difficult.

Further, the increase of the transistor density in a circuit and the increase of the transistor switching frequencies generate the occurrence of hot spots in the chips. The heat flows may be greater than 300 W/cm². If a hot spot appears in the first chip, the thermal radiation on the second chip may deteriorate the latter.

SUMMARY OF THE INVENTION

An object of an embodiment of the present invention is to provide a three-dimensional assembly of electronic chips avoiding at least some of the disadvantages of prior art assemblies.

A more specific object of an embodiment of the present invention is to avoid the adverse impact of the thermal radiation of a chip on another one.

Another object of an embodiment of the present invention is to transform at least part of the heat radiated by a chip into electric power.

Another object of an embodiment of the present invention is to provide a three-dimensional assembly of decreased thickness.

Thus, an embodiment of the present invention provides an interface plate capable of being mounted between first and second surface-mounted electronic chips, this plate comprising a plurality of first, second, and third through openings, the first openings being filled with a conductive material and being arranged to be in front of pads of the first and second chips during the assembly, the second openings being filled with a second material, the third openings being filled with a third material, the second and third materials forming two complementary components of a thermoelectric couple.

According to another embodiment of the present invention, the second or the third material is identical to the conductive material.

According to another embodiment of the present invention, the second and the third material belong to the group comprising silicon, germanium, copper, tungsten, and aluminum.

According to another embodiment of the present invention, the interface plate comprises at least one assembly of first thermoelectric couples cooperating with the first chip, the first couples being series-connected.

According to another embodiment of the present invention, the interface plate comprises at least one second assembly of second thermoelectric couples cooperating with the second chip, where the second couples are series-connected to one another and are not series-connected with the first couples.

Another embodiment of the present invention provides an electronic device comprising:

a first surface-mounted electronic chip, a second surface-mounted electronic chip, an interface plate such as described hereabove on either side of which the first and second chips are mounted.

The foregoing objects, features, and advantages of the present invention will be discussed in detail in the following non-limiting description of specific embodiments in connection with the accompanying drawings.

DETAILED DESCRIPTION

Figure 1:
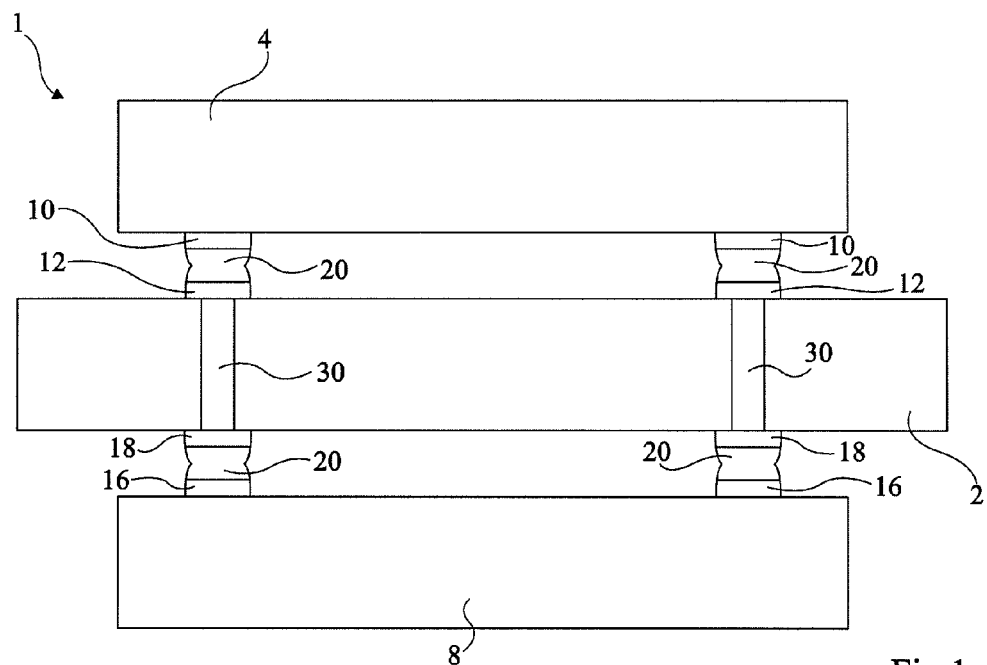
FIG. 1 is a simplified cross-section view of an electronic device comprising two chips interconnected by an interface plate.

For clarity, the same elements have been designated with the same reference numerals in the different drawings and, as usual in the representation of integrated circuits, the various drawings are not to scale.

FIG. 1 is a simplified cross-section view showing an electronic device 1 comprising an interface plate 2. Electronic chips 4 and 8 are arranged on either side of plate 2. The chips are of surface-mounted type. Chip 4 comprises a plurality of connection pads 10. For clarity, only two pads 10 are shown in FIG. 1. Each of pads 10 is intended to be arranged in front of a connection pad 12 of plate 2. Similarly, two connection pads 16 arranged in front of two connection pads 18 of plate 2 have been shown on chip 8. On each of pads 10, 12, 16, and 18 is arranged a solder bump intended to be soldered with an opposite bump. The bump assemblies are designated with reference numeral 20. The connection pads may be made of copper and the bumps may be made of tin-silver. The bumps, for example, have a 100-micrometer diameter.

Any other surface-mounting connection mode may be used.

Connection pads 12 and 18 formed on either side of plate 2 are electrically connected by vias 30.

In a configuration in which chip 4 is a microprocessor and chip 8 comprises memories, chip 4 is warmer than chip 8 when device 1 is in operation. Terms "hot chip" and "cold chip" will be used hereafter.

When a hot spot appears at the surface of chip 4 opposite to interface plate 2, the heat flow diffuses towards the plate, which behaves as a thermal distributor.

Figure 2:
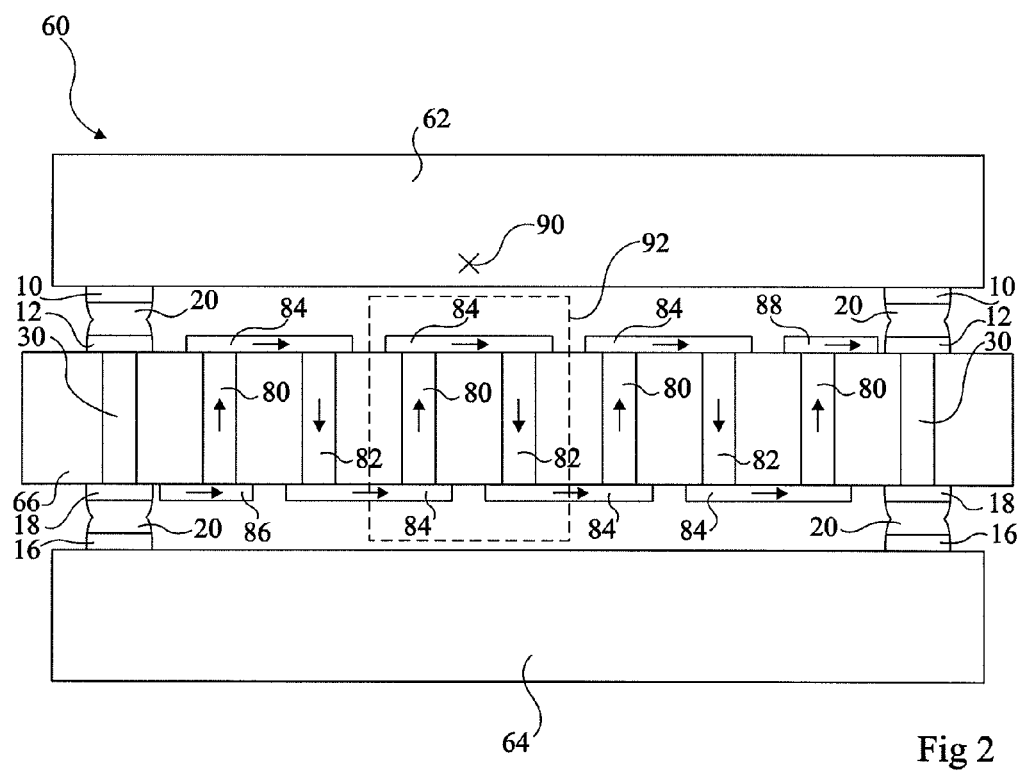
FIG. 2 is a simplified cross-section view of an electronic device according to an embodiment of the present invention.

FIG. 2 shows an electronic device 60 enabling to transform part of the thermal power radiated by a hot chip into electric power, the hot chip being arranged in front of a cold chip.

Device 60 comprises a chip 62 connected to a chip 64 via an interface plate 66. As previously, plate 66 comprises vias 30 arranged between pads 12 and 18. As an example, the conductive material of the vias may be copper, tungsten, or aluminum.

Interface plate 66 also comprises a first set of a plurality of through openings 80 and a second set of a plurality of through openings 82. Openings 80 and 82 alternate. The first material filling openings 80 forms a first component of a thermoelectric couple. The second material filling openings 82 forms the second complementary material of the couple. The first and second materials are different and may belong to the group comprising silicon, germanium, copper, tungsten, and aluminum. Materials such as bismuth, tellurium, lead, and antimony may also be provided.

The thermoelectric couples are series-connected. In FIG. 2, two adjacent thermoelectric couples, each of which is formed of two complementary components 80 and 82, are electrically connected by a connection element 84. This connection element is for example made of copper. Elements 84 are arranged on either side of plate 66. The two openings 80 arranged at the end of plate 66 are respectively connected to a connection terminal 86 and to a connection terminal 88. Connection terminal 86 provides the connection between component 80 and a connection pad, not shown. Connection terminal 88 does the same. Connection terminals 86 and 88 are for example made of copper.

Each of chips 62 and 64 comprises a plurality of connection pads 10, 16, for example arranged at the periphery of each of the chips. The electric connection between each of chips 62 and 64, on the one hand, and plate 66, on the other hand, is provided by surface mounting.

When device 60 is in operation, it is considered that chip 62 is a hot chip and that chip 64 is a cold chip. There thus is a temperature difference between chip 62 and chip 64. A voltage difference between the two connection terminals 86 and 88 is then generated by the Seebeck effect. The electric voltage difference is directly proportional to the temperature difference. A current thus flows in the direction indicated by the arrows in FIG. 2.

In a local approach, when a hot spot 90 appears at the surface of chip 62 in front of thermoelectric couple 92, a voltage difference between terminals 84 in front of chip 64 is generated by the Seebeck effect. An electric current flows in couple 92 in the direction indicated by the arrows. Similarly, each thermoelectric couple may generate a potential difference if it is submitted to a temperature gradient. An electric current can then flow in each thermoelectric couple. Since the thermoelectric couples are assembled in series, a current thus flows in the direction indicated by the arrows of FIG. 2.

The electric current thus generated can be recovered at the level of connection terminal 88. Connection terminals 86 and 88 may, for example, be connected to a microbattery or to a buffer capacitor. This stored power may be used to supply chip 64 or chips external to electronic device 60, to maintain, for example, a power supply during stand-by periods. Thus, the general power consumption of an assembly of electronic chips can be decreased.

The Applicant has noted that, for an electronic device comprising two chips having a size of 3×3 mm², one of them for example being a multimedia processor for cell phone applications, the other having a negligible power consumption, for example, being a chip only comprised of memories, and an interface plate interposed between the two chips, approximately 60 mW can be generated for a 30° C. temperature difference between the two chips.

An interface plate arranged between the two 3×3-mm² chips may, for example, comprise 100,000 vias and 15,000 thermo-electric couples. The vias may be arranged at the periphery of plate 66 and the thermoelectric couples may be arranged in the internal area delimited by the vias.

The areas likely to generate hot spots at the surface of the processor in operation can be determined before assembly. It can thus be provided to form an adapted interface plate 66. The thermoelectric couples are then arranged in an area of the plate in front of the hot spots which are likely to appear, once the plate has been interposed between the two chips.

Similarly, an interface plate capable of being interposed between first and second hot chips each capable of generating several hot spots may be provided. A set of thermo-electric couples is formed on the interface plate in front of each hot spot likely to appear on the chips. The sets capable of cooperating with the hot spots generated by the first processor may be series-connected. The same applies for the sets capable of cooperating with the hot spots generated by the second processor. It will be ascertained not to connect these two sets in series. Indeed, a voltage of opposite sign would be generated between each of these sets. Their contribution to the electric current would cancel. Each of the two sets may independently contribute to the charge of a battery, for example.

Interface plate 66 may be used as a security device. If the voltage between terminals 86 and 88 is greater than a predetermined threshold voltage, it may be provided to stop the operation of the hot chip.

The material forming interface plate 66 may be silicon or a polymer. If the material is a high resistivity silicon (resistivity greater than 500 ohms·cm, preferentially greater than 1000 ohms·cm) or a polymer, one can advantageously foresee not to isolate by an insulating layer the plate 66 from the vias 30 and the openings 80, 82 filled with materials constituting the thermoelectric couple. If the material has a low resistivity, an isolation layer will be provided between the silicon and the material constituting the via or an element of a thermoelectric couple.

The interface plate has a thickness ranging between 80 and 200 µm, preferably between 100 and 150 µm. Such a plate thickness enables forming an electronic device 60 having a total thickness ranging between 300 and 1,000 µm, preferably between 500 and 800 µm.

FIGS. 3A to 3E illustrate an embodiment of a method for manufacturing interface plate 66, adapted to such thicknesses.

Figure 3A:
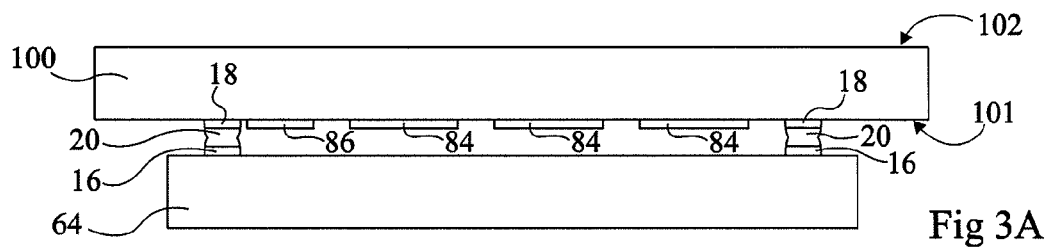
FIGS. 3A to 3E are simplified cross-section views illustrating a method for manufacturing an interface plate according to an embodiment of the present invention.

FIG. 3A shows a substrate 100, for example, made of polymer or silicon, comprising connection elements 84, a connection element 86, and connection pads 18 deposited on lower surface 101 of the substrate. Substrate 100 is connected to a chip 64 by surface mounting.

Figure 3B:
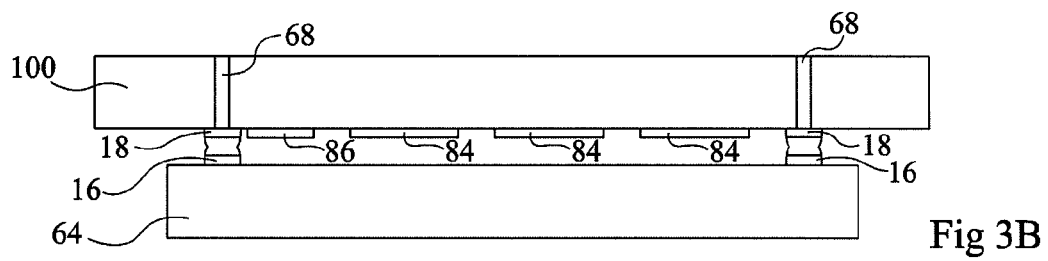

At the step shown in FIG. 3B, a photolithography step is carried out. The through openings thus obtained are then filled with a conductive material to form vias.

Figure 3C:
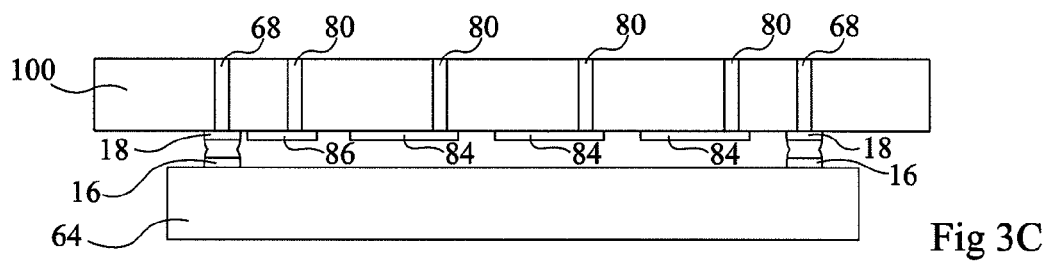

At the step illustrated in FIG. 3C, openings 80 have been formed and filled with a material forming a first component of the thermoelectric couple.

Figure 3D:
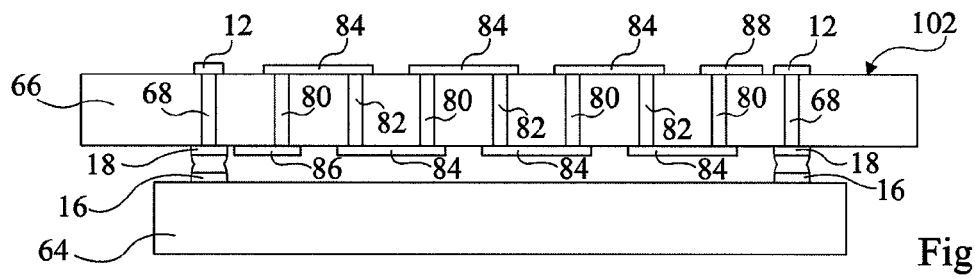

At the step illustrated in FIG. 3D, through openings 82 have been formed and filled with a material forming the second complementary component of the thermoelectric couple. On upper surface 102 of substrate 100, pads 12 and connection elements 84 and 88 have been deposited. Interface plate 66 mounted on chip 64 is thus obtained.

Figure 3E:
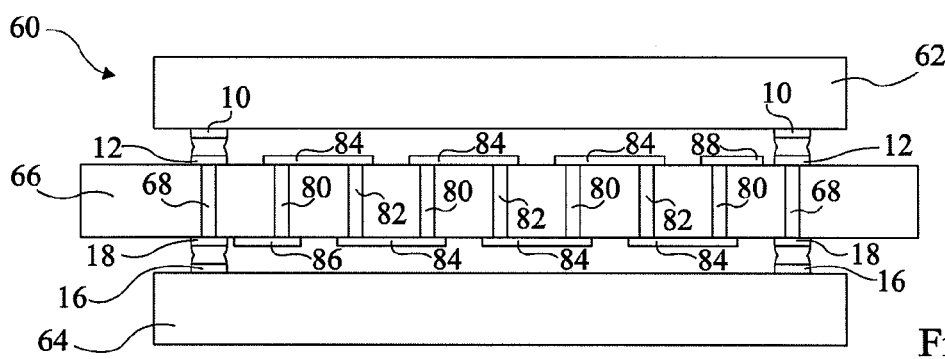

At the step shown in FIG. 3E, chip 62 and plate 66 have been connected by the assembly of bumps 20 interposed between connection pads 10 and 12. Electronic device 60 is thus obtained.

As a variation of the above-disclosed method, substrate 100 may be attached to a handle, for example made of silicon. Steps 3A to 3E are then carried out in this configuration. The handle is then removed and chip 64 is attached to plate 66 after pads 18 and connection elements 84 and 86 have been formed.

The successive steps of forming of openings 68, 80, and 82 may be carried out in a different order.

It may advantageously be provided to use the same material to form conductive vias 68 and one of the components of the thermoelectric couple. Thus, a photolithographic etch step and a step of filling of the openings can be eliminated.

For the filling of each of the through openings, it may be provided to use a material conventionally used in the manufacturing of electronic chips. Thus, advantage can be taken of the existing know-how in semiconductor production units. Such materials may be silicon, germanium, copper, tungsten, or aluminum.

The manufacturing method of the interface plate makes it possible to easily form thermoelectric couples serially connected between two connection terminals.

Air cavities are present between each chip 62, 64 and the interface plate 66. To fill these cavities, a polymer could be injected by a syringe for encapsulation.

Specific embodiments of the present invention have been described. Different variations and modifications will occur to those skilled in the art. In particular, if substrate 100 has a thickness greater than 100 μm, it may be provided to form interface plate 66 autonomously, that is, without making its solid with chip 64 or a handle. Indeed, the substrate then is rigid enough to be handled.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An interface plate capable of being mounted between first and second surface-mounted electronic chips, the plate comprising a plurality of first, second, and third through openings, the first openings being filled with a conductive material and being arranged to be in front of pads of the first and second chips during the assembly, the second openings being filled with a second material, the third openings being filled with a third material, wherein the second and third materials are not identical to each other, forming two complementary components of a thermoelectric couple.

2. The plate of claim 1, wherein the second or the third material is identical to the conductive material.

3. The plate of claim 1, wherein the second and the third material belong to the group comprising silicon, germanium, copper, tungsten, and aluminum.

4. The plate of claim 1, comprising at least one set of first thermoelectric couples cooperating with the first chip, the first couples being series-connected.

5. The plate of claim 4, wherein the serially connected couples are connected between connection terminals for connection to a microbattery or a buffer capacitor.

6. The plate of claim 4, comprising at least a second set of second thermoelectric couples cooperating with the second chip, where the second couples are series-connected to one another and are not series-connected with the first couples.

7. The plate of claim 1, made of silicon.

8. The plate of claim 7, wherein the silicon has a resistivity greater than 500 ohms·cm.

9. The plate of claim 8, wherein the silicon has a resistivity greater than 1000 ohms·cm.

10. An electronic device comprising:
a first surface-mounted electronic chip,
a second surface-mounted electronic chip,
an interface plate according to claim 1, on either side of which the first and second chips are mounted.

* * * * *